United States Patent [19]

Jacquet et al.

[11] Patent Number: 5,283,799
[45] Date of Patent: Feb. 1, 1994

[54] SEMICONDUCTOR LASER WITH A SATURABLE ABSORBER

[75] Inventors: Joël Jacquet, Orsay; Denis Leclerc, Bourg la Reine; Jean-Louis Lievin, Paris; Didier Sigogne, Villebon sur Yvette, all of France

[73] Assignee: Alcatel N.V., Amsterdam, Netherlands

[21] Appl. No.: 841,712

[22] Filed: Feb. 26, 1992

[30] Foreign Application Priority Data

Feb. 27, 1991 [FR] France .................. 91 02352

[51] Int. Cl.[5] .................................. H01S 3/19
[52] U.S. Cl. ............................ 372/50; 372/46
[58] Field of Search .................. 372/50, 45, 46

[56] References Cited

U.S. PATENT DOCUMENTS 4,920,542  4/1990  Brosson et al. .................. 372/50

FOREIGN PATENT DOCUMENTS 0338863  10/1989  European Pat. Off. .
58-202581  11/1983  Japan .

Primary Examiner—James W. Davie
Attorney, Agent, or Firm—Robbins, Berliner & Carson

[57] ABSTRACT

In this laser two successive sections of a light guide form a light amplifier (S1) and a saturable absorber (S2). In the invention a passive section (S3) of the guide follows the absorber. The invention is applicable especially to processing an optical signal.

8 Claims, 2 Drawing Sheets

SEMICONDUCTOR LASER WITH A SATURABLE ABSORBER

TECHNICAL FIELDS

The present invention relates to a laser formed by a semiconductor material and comprising a saturable optical absorber. Such an absorber has a limited capacity to absorb light energy, which capacity is called the absorbance. This absorbance can be controlled electrically. A hysteresis loop appears in the graph relating the emitted light power of such a laser to the electrical current powering the laser; the width of this loop is related to the absorbance and may thus also be controlled electrically. A laser with such a loop is sometimes said to be bistable.

Semiconductor lasers with saturable absorbers have already been the subject of many publications and their potential uses for processing optical signals regularly arouse interest.

BACKGROUND ART

A document from Japan (PATENT ABSTRACTS OF JAPAN, vol. 8, No. 49 (E-230) [1486], 6th Mar. 1984; & JP-A 58 202 581 NIPPON DENSHIN DENWA KOSHA, 25th Nov. 1983) describes a known laser of this kind. In this laser, two top electrodes follow each other over a light guide. One injects a power supply current through an amplifier forming a section of the guide. This current passes through a semiconductor junction in which the guide is inserted. This current thus injects carriers of opposite conductivity type into the guide, which enables the amplifier to effect the amplification needed to build up a light oscillation. The other top electrode injects an absorbance control current into a saturable absorber which is formed by another section of the guide. This current controls the absorbance of the absorber. The absorber is followed by a passive guide.

Other applications of some of the concepts underlying the present invention are disclosed in the commonly assigned U.S. patent application of J. Chesnoy et al. entitled POSITIVE FEEDBACK DEVICE FOR PROCESSING AN OPTICAL SINGAL, filed concurrently herewith under Ser. No. 07/841,710. To the extent such copending application may contain any additional information that might be of any assistance in the use and understanding of the invention claimed herein, It is hereby incorporated by reference.

DISCLOSURE OF INVENTION

The present invention seeks to attain at least some of the following objects:

Rapid control of absorbance of the absorber of a semiconductor laser.

The ability to control the absorbance by means of a weak current.

Ease of implementation of such a laser.

In view of these objects, it provides a semiconductor laser with a saturable absorber, in which three successive sections of a light guide comprise a light amplifier, a saturable absorber and a passive section, the laser being characterized in that an electrode extends at least partially over the passive section to pass an absorbance control current through the absorber.

BRIEF DESCRIPTION OF THE DRAWINGS

The way in which the present invention may be implemented is described below with the aid of the accompanying schematic figures, it being understood that the elements and devices described and shown are only by way of non-limiting example.

BEST MODE FOR CARRYING OUT THE INVENTION

Figure 1:
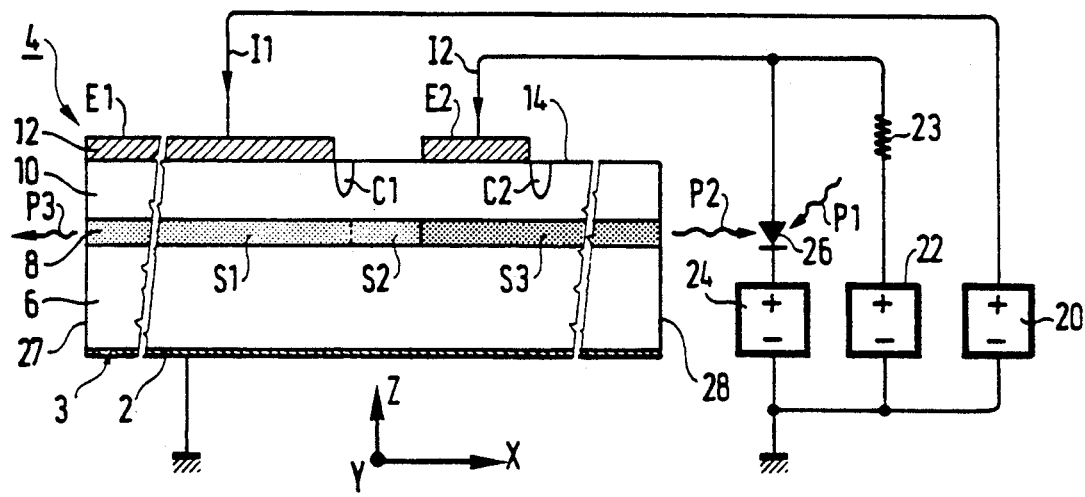
FIG. 1 is a view in longitudinal section of a first device including a laser and embodying the present invention.
Figure 2:
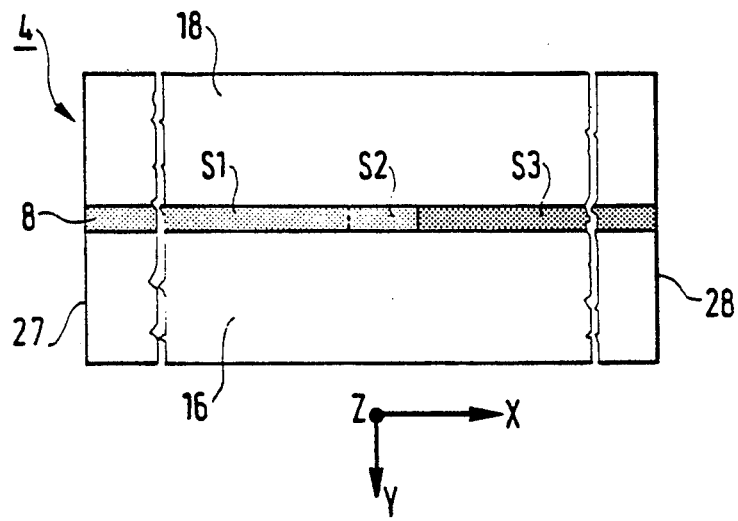
FIG. 2 is a view of a semiconductor wafer of this laser in section through a horizontal plane passing through a light guide layer of the laser.

The device given as an example is a positive feedback device for processing an optical signal. It includes a semiconductor laser with a saturable absorber. The laser is considered first and some features involved in its implementation are described in general terms. These features a analogous, so far as their indicated functions are concerned, to known features described in a document by Lasher (G. J. LASHER. "Analysis of a proposed bistable injection laser", Solid State Electronics, Pergamon Press 1964, vol 7, p 707).

In these features a laser comprises the following stack of layers, following each other in a vertical direction Z defined in relation to the stack:

a bottom electrode layer 2 on a bottom face of a semiconductor wafer 4, a lower confining layer 6 pertaining to the semiconductor wafer and having a first electrical conductivity type and a refractive index, a light guide layer 8 comprising a light guide S1, S2, S3 formed at least partially of a semiconductor material in crystalline continuity with the lower confining layer and having a refractive index greater than that of the lower confining layer to effect vertical optical confinement within this guide layer, an upper confining layer 10 pertaining to said semiconductor wafer and having crystalline continuity with the light guide, a second electrical conductivity type and a refractive index lower than that of the light guide, to effect said vertical optical confinement, and a top electrode layer 12 on a top face 14 of said semiconductor wafer.

The light guide S1, S2, S3 extends in a longitudinal direction X in the light guide layer between two lateral confining regions 16, 18 whose refractive indices are selected to be lower than that of the guide to effect transverse optical confinement, confining light in the guide between these two lateral confining regions. It comprises a sequence of sections along the longitudinal direction, from back to front as follows: A first section is a light amplifier S1. A second section is a saturable absorber, S2 and forms an active unit S1, S2 with the amplifier. The active unit is constituted by an active semiconductor material selected to act with emission light which is propagated at an emission wavelength in the longitudinal direction. This material is adapted to be traversed by electrical currents passing between the two upper and lower confining layers, such currents being measured algebraically in the forward direction relative to the conductivity types of these two layers. The material amplifies the light in the amplifier when an electrical current flowing in the amplifier has a current density above a threshold of amplification. This current thus forms a power supply current I1. The material absorbs the light in the absorber when the electrical current flowing in the absorber has a current density below the threshold of amplification. This current thus forms an absorbance control current I2. The absorber absorbs fresh energy from the light only to the extent that the light energy which has already been absorbed and accumulated during an energy storage interval is lower than its absorbance, this energy storage interval having a limited duration and preceding and including the instant at which the absorber receives the fresh energy. The absorbance is controlled by the control current.

The upper electrode layer comprises: a power supply electrode E1 disposed to transmit the power supply current I1 towards the bottom electrode layer 2 through the amplifier S1, and an absorbance control electrode E2 disposed to transmit the absorbance control current I2 towards the bottom electrode layer through the absorber S2.

The laser further comprises:

a power supply source 20 to provide the power supply current to the power supply electrode, and an absorbance control source 22, 23, 24, 26 to supply the absorption control current to the control electrode E2.

Light reflecting means 27, 28 are located on the two ends of the active unit S1, S2 to form a light emitter emitting said emission light. They are constituted in the device shown by way of example by the rear and front faces 27 and 28 of the wafer 4, these faces being partially reflecting to form a Fabry-Perot resonator. They could also be constituted by external mirrors or by a distributed Bragg reflector inside the wafer.

In conventional manner the power supply and absorbance control electrodes E1 and E2 are in the form of strips having lengths in a transverse direction Y greater than the width of the light guide S1, S2, S3, electrical lateral confining means being provided to prevent at least partially said power supply and absorption control currents I1 and I2 passing though said lateral confining layers 16, 18. These electrical confining means may in particular be formed by a suitable internal composition or structure of these confining regions.

Furthermore, some at least of the advantageous features which are now described in general terms may be adopted and, unless indicated otherwise, are adopted in the embodiment given by way of example.

In one such design whose advantages appear below, the light guide S1, S2, S3 comprises a third section within the semiconductor wafer 4 and in front of the absorber S2, being formed from a passive material selected to transmit said emission light without appreciably affecting either its intensity or its speed of propagation. This section forms a passive section S3. The guide may be simple, each of its sections being geometrically continuous with the preceding sections. The coupling between sections is then longitudinal. The guide may also be composite, being formed for example by two superimposed layers. The coupling between the absorber and the passive section may then be a vertical coupling mutually coupling the two layers.

Moreover the guide may comprise other sections which may be for example a phase shift section and a frequency tuning section, such as are described for making a frequency controlled laser in a document by Kondo (K. KONDO; H. NOBUHARA; S. YAMAKOSHI. "Giga-bit operation of wavelength conversion laser". Paper 13D-9, "Photonic Switching 90" Conference 12-14 April 1990, KOBE, Japan).

Moreover some components not shown may be integrated into the semiconductor wafer. These may be especially a photodiode pertaining to the absorbance control source or an extra light amplifier outside the resonant cavity of the laser.

In another advantageous design which is made possible by the presence of the passive section S3, the absorbance control electrode E2 extends at least partially over this section. This design allows this electrode to have a dimension in the longitudinal direction greater than the length of the absorber. If, as is often the case, this length is smaller than the width of a metal strip which can be made easily to implement this electrode, this design makes for easy implementation of this electrode. At the same time it allows an absorber to be implemented which is shorter than the width of this electrode, which allows the laser to respond rapidly to variations in the absorbance control current.

Another feature may be adopted because of the presence of the passive section S3. It is advantageous if it is desired that the wafer shall have a front cleavage face 28. According to this feature this front face is formed at a front end of the passive section S3. This feature allows a front face of the wafer to be made by a conventional cleaving operation, which is known to involve a lack of accuracy in the position of the face thus formed. This lack of accuracy is acceptable because it affects only the length of this section, while, in the absence of the passive section, the lack of accuracy would affect the length of the absorber and thus prevent a high speed of response of the laser to the absorbance control current being obtained in a reproducible manner.

In another advantageous design, the amplifier S1 and the absorber S2 are connected optically to an optical component 26 though the passive section S3. This design facilitates implementation of an optical circuit including the wafer 4. The component is for example a photodiode 26 which constitutes a light receiver and forms part of the absorbance control source 22, 23, 24, 26.

The presence of the passive section S3 could give rise to the problem of diverting a proportion of the absorbance control current. This is the reason why, according to another advantageous feature, the laser comprises a barrier to electrical current in at least some of the paths leaving the absorbance control electrode E2 for the for the bottom electrode layer 2 and passing though the passive section S3. This feature makes efficient control possible using an absorbance control source supplying a relatively weak current, because a relatively large fraction of the current passes through the absorber, while the condition to be fulfilled in relation to this current in order to achieve efficient control is that its fraction is sufficient.

A particular design for implementing said barrier to the electrical current results from the electrical resistivity of the passive material of the section S3 being substantially greater than that of the active material of the section S1 and S2. This latter feature forms an embodiment of the preceding feature. It can be particularly effective. It is not applied in the device given by way of example as the feature which has been indicated there and which is particularly easy to implement is applied.

In this other advantageous feature, electrically insulating channels are formed in the semiconductor wafer from its top face 14. A rear insulating channel C1 is located longitudinally between the power supply electrode E1 and the absorber S2. A front insulating channel C2 is located longitudinally in the vicinity of the front edge of the control electrode E2 and it forms a barrier to electrical current.

The laser whose various features have been described emits said emission light in the form of a beam P3, in response to an input signal that is electrical, such as the absorbance control current I2. In contrast to this the optical signal processing device which includes this laser emits the light in response to an input signal that is optical. This input signal is formed by a light beam P1 received by the photodiode 26 which constitutes a light receiver included in the absorbance control source. This beam controls a current passing through the photodiode and which forms in part the absorbance control current I2. It thus controls an output signal that is optical constituted by the beam P3.

The current supplied by the light receiver can be very small. This smallness facilitates implementation of the device. It also allows use of a receiver 26 with a rapid response, such as a reverse-biased PIN type photodiode. The use of such biasing of the photodiode is made possible, without risk of the wafer 4 deteriorating, because the current I2 is forwards current. The biasing is realized by a potential source 24 for example. The current I2 is formed by the sum of the current passing through the photodiode and a pre-biasing current supplied through a resistance 23 by another potential source 22. These two potential sources and the photodiode together constitute the absorbance control source.

Various particulars of the elements referred to above are now presented in more detail.

The wafer 4 has been made from an n-doped indium phosphide InP substrate epitaxially doped in liquid phase. The active (sections S1 and S2) and passive (section S3) materials employed will be called type 1 and type 2 below. They are quaternary alloys that are not intentionally doped. They are of the type $In_{1-x}Ga_x As_yP_{1-y}$ formed from indium, gallium, arsenic and phosphorus and match the lattice of the substrate. These materials have respective forbidden bands corresponding to wavelengths of 1,530 nm and 1,300 nm. The first of these wavelengths forms said emission wavelength. The confining materials, i.e. those of the confining layers, are the n-doped InP substrate for the lower confining layer 6 and a p-doped InP epitaxial layer for the top confining layer 10. An epitaxial contact layer is not shown. Its thickness is 200 nm. It is formed by a heavily p-doped quaternary contact material of type 2. Such a layer is present under the electrodes E1 and E2.

The wafer 4 has been made according to the recited indium phosphide channel technology but its principle of implementation may be transferred to any other system of semiconductor materials, such as gallium arsenide (GaAs) technology. The type 1 and type 2 materials may equally be replaced by more complex structures such as super-lattice structures with multiple quantum wells, or a stack of layers of different doped or undoped materials. It is sufficient if the structure replacing the material 1 has optical gain at the desired emission wavelength and that the structure replacing the type 2 material is transparent at this same wavelength.

The active and passive materials should be surrounded on both sides by confining materials likewise transparent to the emission wavelength, in order to form a single mode waveguide. A material will be called transparent if its absorption per unit length is less than 50 cm$^{-1}$. The various elements of the wafer 4 may be more specifically as follows:

The amplifier S1 and absorber S2 are made of type 1 material, called active, and exhibiting a maximum optical gain at the emission wavelength and not intentionally doped n-type to $10^{17}cm^{-3}$.

The passive section S3 is made of type 2 material, called passive, transparent at the emission wavelength, exhibiting a maximum optical gain at the wavelength of 1,300 nm, n-type doped to $5.10^{17}cm^{-3}$.

The upper confining layer 10 is of p-type InP doped to a concentration in the range $10^{17}cm^{-3}$ to $2.10^{18}cm^{-3}$, typically over 1000 nm thick.

The lower confining layer 6 is of n-type InP doped to a concentration in the range $10^{17}cm^{-3}$ to $5.10^{18}cm^{-3}$, typically over 1000 nm thick.

The absorber S2 is not powered directly by the electrode E1. It has a saturable absorbance at the emission wavelength. Its length may lie typically in the range 0.005 mm to 0.025 mm. Its implemented length is for example 0.01 mm.

The size of the electrode E1 in said longitudinal direction may lie typically in the range 0.1 mm to 0.6 mm, for example 0.4 mm.

The absorbance control electrode E2 is typically located near the transition between the active and passive materials (at a distance less than 0.01 mm) and thus near the saturable absorber Its size in the X direction may vary in the range 0.001 mm to 0.1 mm. It directly determines the value of the control current I2. It is advantageous to make this electrode as narrow as possible, an implemented value being 0.085 mm.

The insulating channels C1 and C2 are sunk into the contact material (not shown) and the upper confining layer 10 in order to define the resistance values between sections or between electrodes. These channels may typically have a width of 0.005 mm and a depth equal to ¾ the total thickness of the contact material and the material of the upper confining layer.

The electrical resistance between the power supply electrode E1 and the saturable absorber S2 may lie in the range 100 ohms to 10,000 ohms. Values in the range 200 ohms to 1,400 ohms have been tested.

The electrical resistance between the control electrode E2 and the saturable absorber S2 has been tested with a value of 20 ohms.

Figure 3:
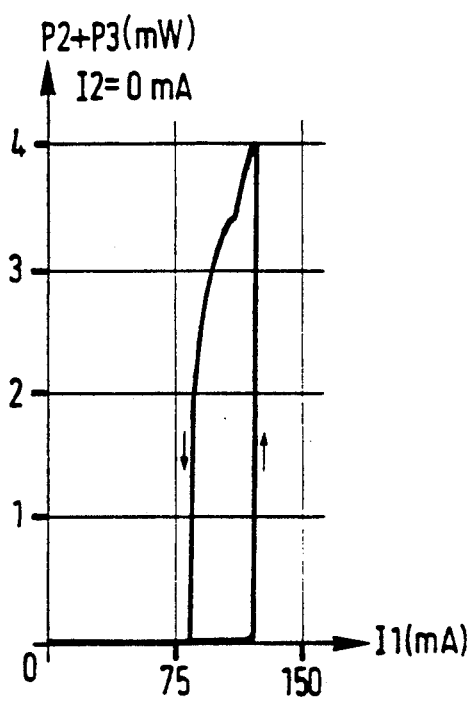
FIGS. 3 to 6 are graphs showing the variation in emitted optical power of this semiconductor wafer as a function of the power supply current injected into an amplifier of the wafer, for four values of an absorption control current injected into an absorber of the wafer.
Figure 4:
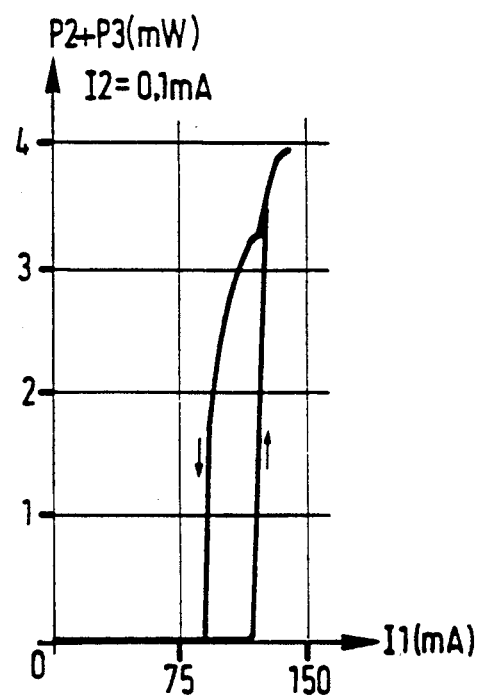
Figure 5:
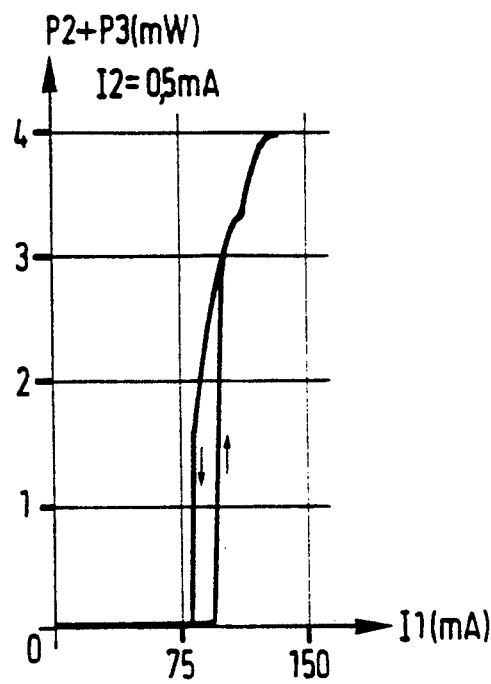
Figure 6:
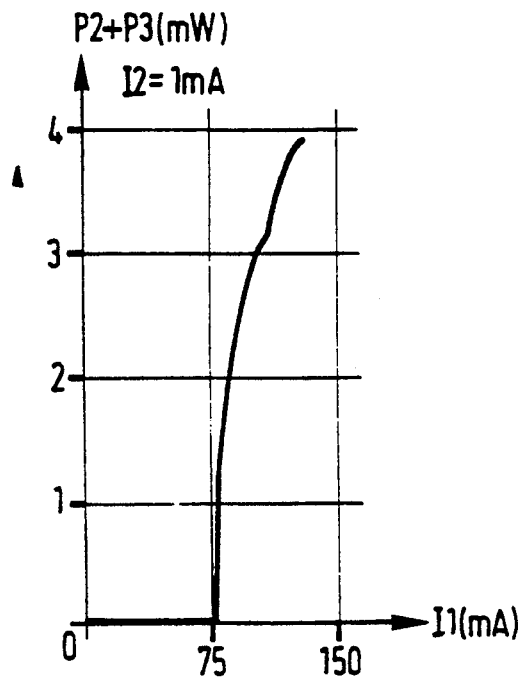

FIGS. 3, 4, 5 and 6 show the behavior of the laser implemented as described above for four values of the control current I2, namely 0 mA, 0.1 mA, 0.5 mA, and 1 mA respectively.

They show the hysteresis loop of emitted optical power (as ordinate) as a function of current (as abscissa) injected into the laser through the power supply electrode E1.

It is remarkable that a current I2 as low as 0.1 mA enables the absorbance of the saturable absorber to be controlled. A complete closure of the hysteresis loop is obtained with a change in I2 of less than 1 mA. An increase in I2 mainly reduces the value of the current I1 which causes the light emission but it is important to note that the value of the current I1 causing extinction is likewise reduced.

An important consideration in the present invention lies in that the size of the hysteresis loop of a bistable semiconductor laser can be controlled by very weak control currents, typically less than a milliamp and that this control is effected by forward biasing of the semiconductor junction which receives the current within the laser. This makes it possible to realize more easily a feedback processing device in which the internal electrical signal 12 is supplied by a reverse-biased photodiode, such as 26.

We claim:

1. A semiconductor laser comprising:
   a light guide defined in a semiconductor substrate and further comprising
      a light amplifier section for producing an emission light in response to an amplification current flowing through said light amplifier section,
      a passive section for transmitting the emission light in substantially unaltered form, and
      a saturable absorber section optically coupled between said light amplifier section and said passive section for absorbing said emission light when an absorbance control current flowing through the saturable absorber section is below a predetermined threshold; and
   an absorbance control electrode electrically coupled between a source of said absorbance control current and said saturable absorber section, said electrode being disposed on said semiconductor substrate above said light guide and extending at least partially over said passive section.

2. A semiconductor laser comprising:
   a semiconductor wafer,
   a bottom electrode layer on a bottom face of said semiconductor wafer,
   a lower confining layer defined in said semiconductor wafer and having a first electrical conductivity type and a first refractory index,
   a light guide layer defined in said semiconductor wafer above and in crystalline continuity with said lower confining layer, said light guide layer including a longitudinally extending light guide having a second refractive index greater than said first refractive index to effect vertical optical confinement in said light guide above said lower confining layer, and two lateral confining regions having respective third and fourth refractive indices lower than said second refractive index to effect transverse optical confinement in said guide, said light guide further comprising
   an active unit including an active section and an absorber section and consisting of an active semiconductor material which acts upon emission light which is propagated with an emission wavelength in the longitudinal direction of the light guide in response to electrical currents passing between said upper and lower confining layers and producing a current density measured algebraically in a forwards direction relative to said first and second conductivity types, said active semiconductor material amplifying the emission light in said amplifier section when subjected to a power supply current having a current density above a threshold of amplification, the active semiconductor material absorbing the light in the absorber section when subjected to an absorbance control current having a current density below the threshold of amplification, the absorber section absorbing new energy from the light only to the extent that light energy which a has already been absorbed and accumulated during an energy storage interval is lower than a predetermined absorbance of the absorber section, said energy storage interval having a limited duration and preceding and including the instant at which the absorber receives said new energy, the predetermined absorbance being controlled by said absorbance control current, and
   a passive section consisting of a passive material which transmits said emission light without appreciably affecting either its intensity of its speed of propagation,
   an upper confining layer defined in said semiconductor wafer above and in crystalline continuity with said light guide layer, said upper confining layer having a second electrical conductivity type and a fifth refractive index lower than said second refractive index, to effect vertical optical confinement in said light guide below said lower confining layer,
   a top electrode layer on a top face of said semiconductor wafer and further comprising
      a power supply electrode disposed to transmit said power supply current towards said bottom electrode layer through said amplifier section, and
      an absorbance control electrode disposed to transmit said absorbance control current towards said bottom electrode layer through said absorber section, said absorbance control electrode being at least partially disposed over said passive section,
   a power supply source to provide said power supply current to the power supply electrode,
   an absorbance control source to supply said absorption control current to said absorbance control electrode, and
   light reflecting means located at two opposite ends of the light guide so that said semiconductor wafer forms a light emitter emitting and cooperating with the light guide to form a resonator.

3. A laser according to claim 2, further comprising a current barrier for blocking a portion of the absorbance control current otherwise passing through the passive section.

4. A laser according to claim 3, wherein the electrical resistivity of said passive material is substantially greater than that of said active material.

5. A laser according to claim 3, wherein
   the current barrier further comprises
      a front electrically insulating channel extending downwardly from a top face of the semiconductor wafer and being located longitudinally in the vicinity of a front edge of said absorbance control electrode, and
   said laser further comprises
      a rear electrically insulating channel extending downwardly from the top face of the semiconductor wafer located longitudinally between the power supply electrode and the absorber.

6. A laser according to claim 2, wherein said semiconductor wafer has a front cleavage face forming a front end of said passive section.

7. A laser according to claim 2, wherein said amplifier section and said absorber section are optically coupled to an optical device through said passive section.

8. A laser according to claim 2, wherein said power supply electrode and said absorbance control electrode are each in the form of a strip having a length in a transverse direction sufficiently great to extend over at least a portion of each of said two lateral confining regions, and said laser further comprises
electrical lateral confining means for blocking a portion of the power supply and absorption control current otherwise passing through said lateral confining layers.

* * * * *